(12) United States Patent
Tsukimura (10) Patent No.: US 9,748,178 B2
(45) Date of Patent: Aug. 29, 2017

(54) SEMICONDUCTOR DEVICE, SOLID-STATE IMAGING DEVICE, AND IMAGING DEVICE

(71) Applicant: OLYMPUS CORPORATION, Tokyo (JP)

(72) Inventor: Mitsuhiro Tsukimura, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 14/944,688

(22) Filed: Nov. 18, 2015

(65) Prior Publication Data

US 2016/0071897 A1    Mar. 10, 2016

Related U.S. Application Data

(63) Continuation of application No. PCT/JP2014/059547, filed on Mar. 31, 2014.

(30) Foreign Application Priority Data

Jun. 7, 2013  (JP) .................. 2013-121045

(51) Int. Cl.
*H01L 23/544* (2006.01)
*H01L 21/66* (2006.01)
(Continued)

(52) U.S. Cl.
CPC ............ *H01L 23/544* (2013.01); *H01L 22/30* (2013.01); *H01L 24/16* (2013.01);
(Continued)

(58) Field of Classification Search
CPC ......... H01L 22/30; H01L 22/32; H01L 22/34; H01L 23/544; H01L 2021/60067;
(Continued)

(56) References Cited

U.S. PATENT DOCUMENTS 6,933,505 B2 * 8/2005 Vuorela ............ H01L 27/14634
                                                    250/370.11
6,946,732 B2 * 9/2005 Akram ................... H01L 23/16
                                                          257/730
(Continued)

FOREIGN PATENT DOCUMENTS

JP    03-142820 A    6/1991
JP    3-214629 A     9/1991
(Continued)

OTHER PUBLICATIONS

International Search Report dated Jun. 3, 2014, issued in counterpart International Application No. PCT/JP2014/059547 (2 pages).
(Continued)

*Primary Examiner* — Eduardo A Rodela
(74) *Attorney, Agent, or Firm* — Westerman, Hattori, Daniels & Adrian, LLP (57) ABSTRACT

A semiconductor device includes a first substrate, a second substrate, a connection part, and an alignment mark. The connection part includes a first electrode which is disposed on the first substrate, a second electrode which is disposed on the second substrate, and a connection bump which connects the first electrode and the second electrode. The alignment mark includes a first mark which is disposed on the first substrate and a second mark which is disposed on the second substrate. A sum of a height of the first mark and a height of the second mark is substantially equal to a sum of a height of the first electrode, a height of the second electrode, and a height of the connection bump.

9 Claims, 7 Drawing Sheets

(51) Int. Cl.
*H01L 27/32* (2006.01)
*H01L 27/146* (2006.01)
*H01L 25/065* (2006.01)
*H01L 23/00* (2006.01)

(52) U.S. Cl.
CPC ...... *H01L 25/0657* (2013.01); *H01L 27/1469* (2013.01); *H01L 27/14634* (2013.01); *H01L 27/14636* (2013.01); *H01L 27/14643* (2013.01); *H01L 27/3251* (2013.01); *H01L 24/13* (2013.01); *H01L 24/81* (2013.01); *H01L 2223/5442* (2013.01); *H01L 2223/54426* (2013.01); *H01L 2224/10135* (2013.01); *H01L 2224/131* (2013.01); *H01L 2224/16148* (2013.01); *H01L 2224/8113* (2013.01); *H01L 2224/81132* (2013.01); *H01L 2224/81191* (2013.01); *H01L 2225/06513* (2013.01); *H01L 2225/06593* (2013.01)

(58) Field of Classification Search
CPC ... H01L 2021/60075; H01L 2021/6009; H01L 27/146; H01L 27/14601; H01L 27/14603; H01L 27/14609; H01L 27/14634; H01L 27/14636; H01L 27/14638; H01L 27/1464; H01L 27/14643; H01L 27/3251
See application file for complete search history.

(56) References Cited

U.S. PATENT DOCUMENTS

| 7,332,423 | B2* | 2/2008 | Starkston | H01L 21/563 |
| | | | | 257/E21.503 |
| 2008/0073782 | A1 | 3/2008 | Shin et al. | |
| 2008/0090313 | A1* | 4/2008 | Kayukawa | H01L 22/20 |
| | | | | 438/15 |
| 2008/0142968 | A1* | 6/2008 | Jadhav | H01L 23/3171 |
| | | | | 257/738 |
| 2012/0127485 | A1 | 5/2012 | Yamauchi | |
| 2012/0313236 | A1* | 12/2012 | Wakiyama | H01L 23/544 |
| | | | | 257/734 |

FOREIGN PATENT DOCUMENTS

| JP | 2003-282616 A | 10/2003 |
| JP | 2004-505273 A | 2/2004 |
| JP | 2006-49361 A | 2/2006 |
| JP | 2006-054222 A | 2/2006 |
| JP | 2007-155562 A | 6/2007 |
| JP | 2010-219339 A | 9/2010 |
| JP | 2010-272707 A | 12/2010 |
| WO | 02/10721 A2 | 2/2002 |
| WO | 2008/111214 A1 | 9/2008 |

OTHER PUBLICATIONS

Extended (supplementary) European Search Report dated Dec. 7, 2016, issued in counterpart European Patent Application No. 14807753.0. (10 pages).

Office Action dated Jun. 6, 2017, issued in counterpart Japanese Patent Application No. 2013-121045, with English translation. (4 pages).

Office Action dated May 15, 2017, issued in counterpart Chinese Patent Application No. 201480030714.5, with English translation. (14 pages).

* cited by examiner

SEMICONDUCTOR DEVICE, SOLID-STATE IMAGING DEVICE, AND IMAGING DEVICE

This application is a continuation application based on PCT Patent Application No. PCT/JP2014/059547, filed Mar. 31, 2014, whose priority is claimed on Japanese Patent Application No. 2013-121045, filed Jun. 7, 2013. The contents of both the PCT Patent Application and the Japanese Patent Application are incorporated herein by reference.

BACKGROUND OF THE INVENTION

Field of the Invention

The present invention relates to a semiconductor device, a solid-state imaging device, and an imaging device which are formed by connecting a plurality of substrates with each other.

Description of Related Art

In recent years, video cameras, electronic still cameras, and the like have been widely circulated among the public. In such cameras, charge-coupled device (CCD)-type or amplification-type solid-state imaging devices are used. In such an amplification-type solid-state imaging device, signal charges generated by and accumulated in photoelectric conversion units of pixels which receive incident light are guided to amplification units provided in the pixels. Signals amplified by the amplification units are output from the pixels. In an amplification-type solid-state imaging device, a plurality of such pixels are arrayed in a two-dimensional matrix shape. Amplification-type solid-state imaging devices include, for example, complementary metal oxide semiconductor (CMOS)-type solid-state imaging devices which use CMOS transistors, and the like.

In the related art, a general CMOS-type solid-state imaging device employs a scheme in which signal charges generated by photoelectric conversion units of each of pixels arrayed in a two-dimensional matrix shape are sequentially read out for each row. In this scheme, since a timing of light exposure in the photoelectric conversion units of the pixels is decided based on a start and an end of readout of the signal charge, timings of light exposure are different in rows. For this reason, when a fast-moving subject is imaged using such a CMOS-type solid-state imaging device, the subject becomes distorted in a captured image.

In order to remove distortion of a subject, a simultaneous imaging function (global shutter function) which realizes simultaneity in accumulation of signal charges has been proposed. In addition, applications of CMOS-type solid-state imaging devices with the global shutter function are becoming diverse. A CMOS-type solid-state imaging device with the global shutter function generally needs to have an accumulation capacitor which has a light-shielding property to accumulate signal charges generated by photoelectric conversion units before the signal charges are read out. In such a CMOS-type solid-state imaging device of the related art, after all pixels are simultaneously exposed, signal charges generated by photoelectric conversion units are simultaneously transferred to accumulation capacitors in all of the pixels and temporarily accumulated for the moment. The accumulated signal charges are sequentially converted into pixel signals and read out at predetermined readout timings.

In a CMOS-type solid-state imaging device with the global shutter function of the related art, photoelectric conversion units and accumulation capacitors need to be created on the same plane of the same substrate, and thus the size of the substrate increases. Furthermore, during a waiting period before signal charges accumulated in the accumulation capacitors are read out, quality of signals deteriorates due to noise caused by light or noise caused by a leaking current (dark current) occurring in the accumulation capacitors.

Japanese Unexamined Patent Application, First Publication No. 2006-49361 discloses a solid-state imaging device to solve the above problems. This solid-state imaging device includes a MOS image sensor substrate on which micropads are formed on a wiring layer side for each unit cell and a signal-processing substrate on which micropads are formed on the wiring layer side at the position corresponding to the micropads of the MOS image sensor substrate. The MOS image sensor substrate and the signal-processing substrate are connected to each other by microbumps. In addition, Japanese Unexamined Patent Application, First Publication No. 2010-219339 discloses a method for preventing the area of a substrate from increasing. In this method, a solid-state imaging device, in which a first substrate on which a photoelectric conversion unit is formed and a second substrate on which a plurality of MOS transistors are formed are bonded, is used.

In a process in which two substrates (for example, the MOS image sensor substrate and the signal-processing substrate) constituting a semiconductor device such as a solid-state imaging device are connected using microbumps (which will be described hereinafter as bumps) or the like, there is a process of performing positioning of substrates (alignment) in order to prevent deviation during connection (alignment process). Each substrate has a mark that is called an alignment mark. For example, there is an alignment mark obtained by using a base electrode for forming a bump which connects substrates.

SUMMARY OF THE INVENTION

According to a first aspect of the present invention, a semiconductor device includes: a first substrate; a second substrate; a connection part which electrically connects the first substrate and the second substrate; and an alignment mark which is used in alignment of the first substrate and the second substrate. The connection part includes: a first electrode which is disposed on the first substrate; a second electrode which is disposed on the second substrate; and a connection bump which is disposed between the first electrode and the second electrode and which electrically connects the first electrode and the second electrode. The alignment mark includes: a first mark which is disposed on the first substrate; and a second mark which is disposed on the second substrate at a position which corresponds to the position of the first mark and which is insulated from the first mark. A sum of a height of the first mark and a height of the second mark is substantially equal to a sum of a height of the first electrode, a height of the second electrode, and a height of the connection bump.

According to a second aspect of the present invention, in the semiconductor device according to the first aspect of the present invention, the height of the second mark may be substantially equal to a sum of the height of the second electrode and the height of the connection bump.

According to a third aspect of the present invention, in the semiconductor device according to the second aspect of the present invention, the first mark may be an electrode which is disposed on the first substrate. The second mark may be a bump which is disposed on the second substrate.

According to a fourth aspect of the present invention, in the semiconductor device according to the third aspect of the present invention, when the first substrate and the second substrate are seen in plan view, the first mark may surround the second mark.

According to a fifth aspect of the present invention, in the semiconductor device according to the third aspect of the present invention, the bump may be connected with the second substrate and a surface of a base electrode which is formed on a surface of the second substrate. A width of the base electrode may be equal to or smaller than a width of the bump.

According to a sixth aspect of the present invention, a solid-state imaging device includes the semiconductor device according to any one of the first to fifth aspects of the present invention. The first substrate includes a photoelectric conversion element which is configured to output a signal depending on an amount of incident light. The second substrate includes a processing circuit which is configured to process the signal output from the photoelectric conversion element.

According to a seventh aspect of the present invention, a solid-state imaging device includes the semiconductor device according to any one of the third to fifth aspects of the present invention. The second substrate includes a photoelectric conversion element which is configured to output a signal depending on an amount of incident light. The first substrate includes a processing circuit which is configured to process the signal output from the photoelectric conversion element.

According to an eighth aspect of the present invention, an imaging device includes the solid-state imaging device according to the sixth or seventh aspect of the present invention.

DETAILED DESCRIPTION OF THE INVENTION

Hereinafter, embodiments of the present invention will be described with reference to the drawings. An example of a semiconductor device which has two substrates, a connection part which electrically connects these substrates, and an alignment mark to be used in alignment of these substrates will be described below. The semiconductor device according to the present embodiment is a device which can exchange signals between the two substrates via the connection part. The semiconductor device according to the present embodiment is, for example, a solid-state imaging device which has a photoelectric conversion element and performs imaging of subjects.

Figure 1:
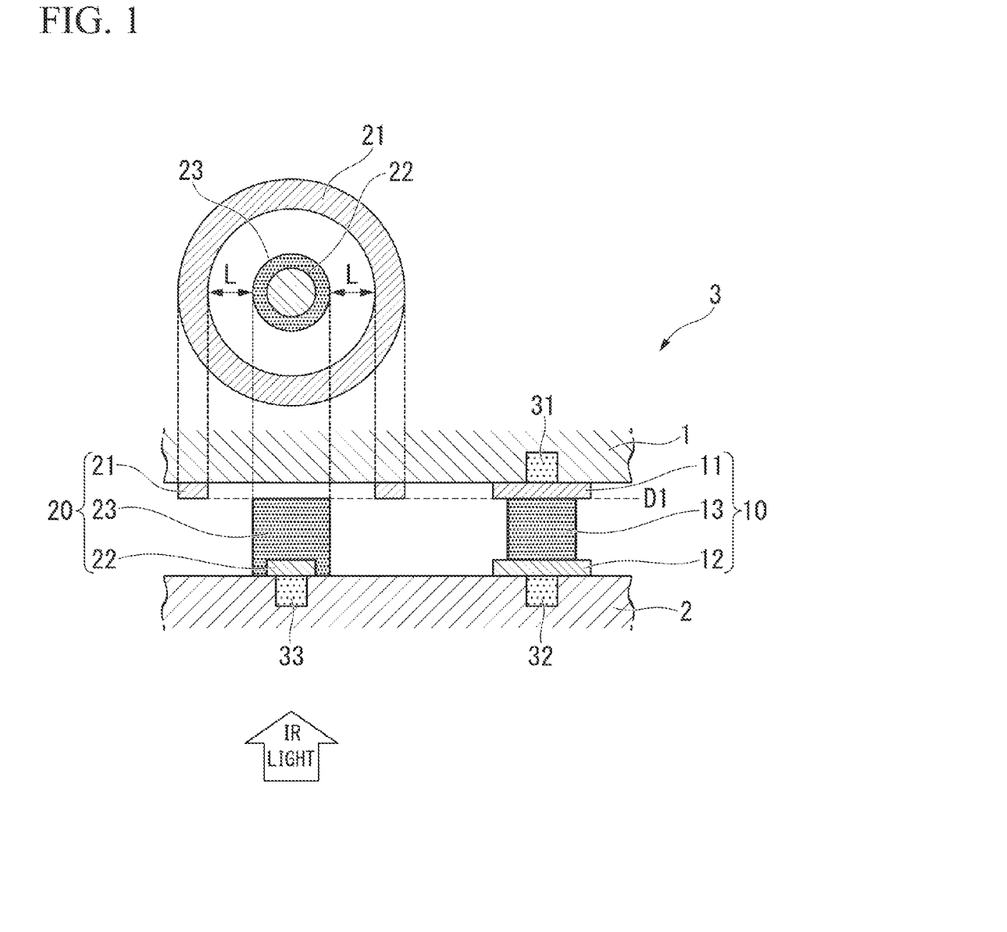
FIG. 1 includes a plan view and a cross-sectional view showing a configuration of a main part of a semiconductor device according to an embodiment of the present invention.

FIG. 1 shows a configuration of a main part of the semiconductor device according to the present embodiment. The upper drawing of FIG. 1 shows a state of an alignment mark provided in the semiconductor device seen in plan view. The lower drawing of FIG. 1 shows a cross-section of the semiconductor device. The configuration shown in FIG. 1 will be described below.

A semiconductor device 3 according to the present embodiment has a semiconductor substrate (a first substrate, a second substrate) 1, another semiconductor substrate (a first substrate, a second substrate) 2, a connection part 10, and an alignment mark 20. The semiconductor substrate 1 and the semiconductor substrate 2 are formed of a material including a semiconductor such as silicon. A main surface (a surface with a larger surface area than a side surface) of the semiconductor substrate 1 and a main surface of the semiconductor substrate 2 face each other. The semiconductor substrate 1 and the semiconductor substrate 2 are connected to each other by the connection part 10. When the semiconductor device 3 is a solid-state imaging device, the semiconductor substrate 1 corresponds to, for example, the first substrate on which a photoelectric conversion unit is formed. The semiconductor substrate 2 corresponds to, for example, the second substrate on which a plurality of MOS transistors are formed. In the respective semiconductor substrate 1 and the semiconductor substrate 2, wiring layers which electrically connect circuits disposed on the substrates are formed in a plurality of layers. The wiring layers on different layers are connected to each other via throughholes or vias. FIG. 1 only illustrates a portion around the surfaces of the semiconductor substrate 1 and the semiconductor substrate 2, and remaining portions are not illustrated (the same applies to FIGS. 3, and 6 to 8).

The connection part 10 has a base electrode (a first electrode, a second electrode) 11, another base electrode (a first electrode, a second electrode) 12, and a bump (connection bump) 13. The base electrode 11 is formed on the surface of the semiconductor substrate 1. The base electrode 12 is formed on the surface of the semiconductor substrate 2. The bump 13 connects the base electrode 11 and the base electrode 12. The base electrode 11, the base electrode 12, and the bump 13 are formed of a conductive material, for example, a metal. The base electrode 11 and the base electrode 12 are formed as, for example, a thin film. The bump 13 is formed as, for example, a columnar structure. The upper surface of the bump 13 is connected with a surface of the base electrode 11. The lower surface of the bump 13 is connected with a surface of the base electrode 12. After the bump 13 is formed on the surface of the base electrode 12, the bump 13 is connected with the base electrode 11 when the semiconductor substrate 1 and the semiconductor substrate 2 are connected to each other.

The base electrode 11 is connected with a through-hole 31 formed inside the semiconductor substrate 1. The through-hole 31 is exposed on the surface of the semiconductor substrate 1. The exposed portion of the through-hole 31 is connected with the base electrode 11. The through-hole 31 is connected to a wiring layer formed inside the semiconductor substrate 1, which is not illustrated. The base electrode 12 is connected with another through-hole 32 formed inside the semiconductor substrate 2. The through-hole 32 is exposed on the surface of the semiconductor substrate 2. The exposed portion of the through-hole 32 is connected with the base electrode 12. The through-hole 32 is connected to a wiring layer formed inside the semiconductor substrate 2, which is not illustrated. With the above-described structure, the semiconductor substrate 1 and the semiconductor substrate 2 are electrically connected. For this reason, signals can be transmitted between the semiconductor substrate 1 and the semiconductor substrate 2 via the connection part 10.

The alignment mark 20 has a base electrode (a first mark) 21, another base electrode 22, and a bump (a second mark) 23. The base electrode 21 is formed on the surface of the semiconductor substrate 1. The base electrode 22 is formed on the surface of the semiconductor substrate 2. The bump 23 is formed on the surface of the semiconductor substrate 2. The base electrode 21, the base electrode 22, and the bump 23 are formed of a conductive material, for example, a metal. The base electrode 21 and the base electrode 22 are formed as, for example, a thin film. The base electrode 22 is an electrode to which, when the bump 23 is formed through electroless plating to be described below, the plating forming the bump 23 is attached. The bump 23 is formed as, for example, a columnar structure. The bump 23 is connected with a surface of the base electrode 22. The bump 23 entirely covers the surface of the base electrode 22. A part of the bump 23 is connected with the surface of the semiconductor substrate 2. In the state in which the semiconductor substrate 1 is connected to the semiconductor substrate 2, the bump 23 is not connected with the semiconductor substrate 1. In this state, there is a space between a surface of the bump 23 and the surface of the semiconductor substrate 1.

When the semiconductor substrate 1 and the semiconductor substrate 2 are seen in plan view, the base electrode 21 has an annular shape (a hollow circle), and the base electrode 22 and the bump 23 have circular shapes. When the semiconductor substrate 1 and the semiconductor substrate 2 are seen in plan view, the base electrode 21 is formed to surround the perimeter of the base electrode 22 and the bump 23. When the semiconductor substrate 1 and the semiconductor substrate 2 are seen in plan view, the diameter of the bump 23 is larger than the diameter of the base electrode 22, and the area of the bump 23 is greater than the area of the base electrode 22. When the semiconductor substrate 1 and the semiconductor substrate 2 are seen in plan view, the width of the base electrode 22 (the width in the direction parallel with the surface of the semiconductor substrate 2; for example, the diameter) is preferably equal to or smaller than the width of the bump 23.

When the semiconductor substrate 1 and the semiconductor substrate 2 are seen in plan view, the base electrode 22 is disposed at a position on the semiconductor substrate 2 which corresponds to the position of the base electrode 21 of the semiconductor substrate 1. That is, when respective positions of the semiconductor substrate 1 and the semiconductor substrate 2 are adjusted so that the base electrode 11 and the bump 13 are connected with each other, the base electrode 22 is disposed so that the base electrode 22 is positioned further inside than the inner circumference of the base electrode 21. To be more specific, when the respective positions of the semiconductor substrate 1 and the semiconductor substrate 2 are adjusted so that the base electrode 11 and the bump 13 are connected with each other, the base electrode 22 is disposed so that the center of the base electrode 22 coincides with the center of the base electrode 21. When ideal alignment has been performed, the center of the base electrode 21, the center of the base electrode 22, and the center of the bump 23 substantially coincide in the state in which the semiconductor substrate 1 and the semiconductor substrate 2 are connected.

The base electrode 21 is formed of the same material that forms the base electrode 11. The base electrode 21 is simultaneously formed with the base electrode 11 in the process of forming the base electrode 11. The base electrode 22 is formed of the same material that forms the base electrode 12. The base electrode 22 is simultaneously formed with the base electrode 12 in the process of forming the base electrode 12. The bump 23 is formed of the same material that forms the bump 13. The bump 23 is simultaneously formed with the bump 13 in the process of forming the bump 13. The base electrode 22 is connected with the through-hole 33 which is formed inside the semiconductor substrate 2. The through-hole 33 is exposed on the surface of the semiconductor substrate 2. The exposed portion of the through-hole 33 is connected with the base electrode 22. The through-hole 33 is connected to a wiring layer formed inside the semiconductor substrate 2, which is not illustrated.

In an alignment process, IR light (infrared light) is radiated from a rear side of the main surface of the semiconductor substrate 2 that is connected to the semiconductor substrate 1. In this state, the alignment mark 20 is observed with an IR microscope (infrared microscope) or an IR camera (infrared camera) from a rear side of the main surface of the semiconductor substrate 1 that is connected to the semiconductor substrate 2. In the alignment process, the relative positions of the semiconductor substrate 1 and the semiconductor substrate 2 in the horizontal direction are adjusted so that the size of the gap between the base electrode 21 and the bump 23 is kept uniform within the alignment mark 20 as a whole (in other words, the distance between the base electrode 21 and the bump 23 is uniform within the alignment mark 20 as a whole). In FIG. 1, the distance between the inner circumference of the base electrode 21 and the outer circumference of the bump 23 is a uniform distance L at any position. By performing alignment so that the distance between the inner circumference of the base electrode 21 and the outer circumference of the bump 23 is uniform through the base electrode 21 and the bump 23, accuracy in the alignment further increases.

In the semiconductor device 3 shown in FIG. 1, the semiconductor substrate 1 corresponds to a first substrate. The semiconductor substrate 2 corresponds to a second substrate. The base electrode 11 corresponds to a first electrode disposed on the first substrate. The base electrode 12 corresponds to a second electrode disposed on the second substrate. The base electrode 21 corresponds to a first mark disposed on the first substrate. The bump 23 corresponds to a second mark disposed at the position on the second substrate corresponding to the position of the first mark.

In the present embodiment, the sum of the height of the base electrode 21 (the width of the base electrode 21 in the vertical direction in the cross-sectional view of FIG. 1; the thickness thereof) and the height of the bump 23 (the width of the bump 23 in the vertical direction in the cross-sectional view of FIG. 1; the thickness thereof) is substantially equal to the sum of the height of the base electrode 11 (the width of the base electrode 11 in the vertical direction in the cross-sectional view of FIG. 1; the thickness thereof), the height of the base electrode 12 (the width of the base electrode 12 in the vertical direction in the cross-sectional view of FIG. 1; the thickness thereof), and the height of the bump 13 (the width of the bump 13 in the vertical direction in the cross-sectional view of FIG. 1; the thickness thereof).

In the semiconductor device 3 configured as described above, the position of the surface of the base electrode 21 and the position of the surface of the bump 23 are substantially the same in the direction perpendicular to the main surface of the semiconductor substrate 1 or the semiconductor substrate 2. Thus, these positions (positions on the dashed line D1 of FIG. 1) can be focused. When these positions are focused, the contour of the base electrode 21 and the contour of the bump 23 can be visually recognized with clarity, and thus accuracy in alignment is improved.

In the present embodiment, the base electrode 11 is simultaneously formed with the base electrode 21. The position of the surface of the base electrode 11 and the position of the surface of the base electrode 21 are substantially the same in the direction perpendicular to the main surface of the semiconductor substrate 1 or the semiconductor substrate 2. In other words, the height of the base electrode 11 is substantially equal to the height of the base electrode 21. In the present embodiment, the bump 13 is simultaneously formed with the bump 23. The position of a surface of the bump 13 and the position of a surface of the bump 23 are substantially the same in the direction perpendicular to the main surface of the semiconductor substrate 1 or the semiconductor substrate 2. That is, the height of the bump 23 is substantially equal to the sum of the height of the base electrode 12 and the height of the bump 13. As a result, when the bump 13 is connected with the base electrode 11, the position of the surface of the base electrode 21 and the position of the surface of the bump 23 are substantially the same in the direction perpendicular to the main surface of the semiconductor substrate 1 or the semiconductor substrate 2. The above-described structure can be easily formed by simultaneously forming the connection part 10 and the alignment mark 20 with no special control.

In the present embodiment, when the semiconductor substrate 1 and the semiconductor substrate 2 are seen in plan view, the bump 23 is larger than the base electrode 22. For this reason, alignment is performed in a state in which the entire base electrode 22 is disposed further inside from the outer circumference of the bump 23. In this state, the IR light radiated from the rear side of the main surface of the semiconductor substrate 2 that is connected to the semiconductor substrate 1 is obstructed by the entire outer circumference of the bump 23. Thus, alignment can be performed with reference to the distance between the inner circumference of the base electrode 21 and the outer circumference of the bump 23. The position of the surface of the base electrode 21 and the position of the surface of the bump 23 are substantially the same in the direction perpendicular to the main surface of the semiconductor substrate 1 or the semiconductor substrate 2. For this reason, alignment can be successfully performed while focus is on the positions.

On the other hand, when the bump 23 is smaller than the base electrode 22, alignment is performed in a state in which the entire bump 23 is disposed further inside than the outer circumference of the base electrode 22. In this state, the IR light radiated from the rear side of the main surface of the semiconductor substrate 2 that is connected to the semiconductor substrate 1 is obstructed by the outer circumference of the base electrode 22. Thus, alignment can be performed with reference to the distance between the inner circumference of the base electrode 21 and the outer circumference of the base electrode 22. The position of the surface of the base electrode 21, however, is different from the position of the surface of the base electrode 22 in the direction perpendicular to the main surface of the semiconductor substrate 1 or the semiconductor substrate 2. For this reason, at least one of the base electrode 21 and the bump 23 cannot be focused. As a result, accuracy in alignment easily deteriorates.

As described above, in the present embodiment, the bump 23 is larger than the base electrode 22. Accordingly, alignment can be performed with reference to the distance between the inner circumference of the base electrode 21 and the outer circumference of the bump 23 in a state in which the surface of the base electrode 21 and the surface of the bump 23 are focused. Therefore, accuracy in the alignment is improved.

Figure 2A:
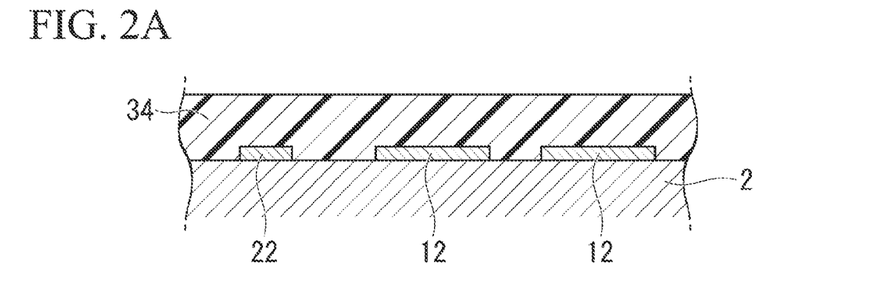
FIG. 2A is a cross-sectional view showing a manufacturing process of a connection part and an alignment mark of the semiconductor device according to the embodiment of the present invention.

FIGS. 2A to 2D show a manufacturing process of the connection part 10 and the alignment mark 20. In FIGS. 2A to 2D, a cross-section of the semiconductor substrate 2 is shown. FIG. 2A shows a state in which, after the base electrodes 12 and the base electrode 22 are formed on the surface of the semiconductor substrate 2, a thin film of a resist 34 is formed on the surface of the semiconductor substrate 2. The resist 34 is formed such that the height of the resist 34 is higher than the heights of the base electrodes 12 and the base electrode 22. In other words, all surfaces of the base electrodes 12 and the base electrode 22 (excluding the surfaces connected with the semiconductor substrate 2) are covered by the resist 34. When the semiconductor substrate 2 is seen in plan view, the base electrodes 12 and the base electrode 22 are formed such that the width of the base electrode 22 is smaller than the width of each base electrode 12. When the semiconductor substrate 2 is seen in plan view, the base electrode 22 is formed in a circular shape.

Figure 2B:
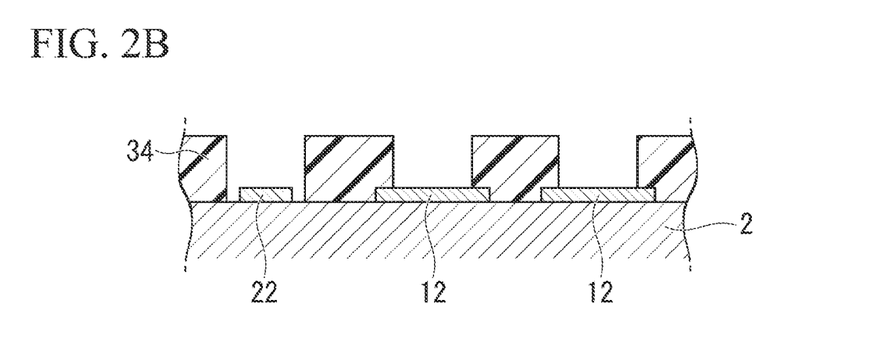
FIG. 2B is a cross-sectional view showing the manufacturing process of the connection part and the alignment mark of the semiconductor device according to the embodiment of the present invention.

FIG. 2B shows a state in which the resist 34 at positions at which the bumps 13 and the bump 23 are to be formed is patterned. Opening parts are formed at the positions at which the base electrodes 12 are formed by removing the resist 34 through etching so that parts of the surfaces of the base electrodes 12 are exposed. Corners of the surfaces of the base electrodes 12 are covered by the resist 34. An opening part is formed at the position at which the base electrode 22 is formed by removing the resist 34 through etching so that the entire surface of the base electrode 22 (excluding the surface connected with the semiconductor substrate 2) and the surface of the semiconductor substrate 2 around the base electrode 22 are exposed. When the semiconductor substrate 2 is seen in plan view, the shape of the opening part formed corresponding to the base electrodes 12 coincides with the shape of the bump 13. The shape of the opening part formed corresponding to the base electrodes 22 coincides with the shape of the bump 23.

Figure 2C:
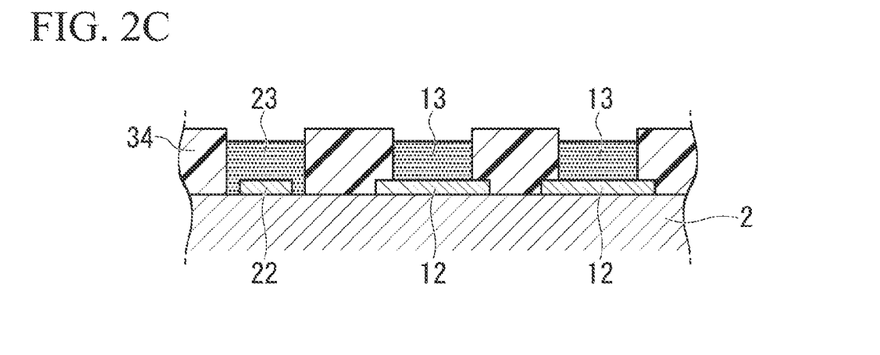
FIG. 2C is a cross-sectional view showing the manufacturing process of the connection part and the alignment mark of the semiconductor device according to the embodiment of the present invention.

FIG. 2C shows a state in which the bumps 13 and the bump 23 are formed in the opening parts formed by removing the resist 34. The bumps 13 are formed at the positions at which the base electrodes 12 are disposed. The bump 23 is formed at the position at which the base electrode 22 is disposed. In the present embodiment, the bumps 13 and the bump 23 are formed through electroless plating as an example. In the electroless plating, plating forming the bumps 13 and the bump 23 is attached to the surfaces of the base electrodes 12 and the base electrode 22. As the plating grows, the bumps 13 and the bump 23 are formed. The bumps 13 and the bump 23 are simultaneously formed. The height of the bumps 13 from the surface of the semiconductor substrate 2 and the height of the bump 23 from the surface of the semiconductor substrate 2 are substantially the same. Since the bumps grow isotropically with respect to the base electrodes in the electroless plating, the bump 23 can be formed further outside than the range in which the base electrode 22 is disposed. Although the method of forming the bumps through electroless plating has been described in the present embodiment, the bumps may be formed using a method other than electroless plating.

Figure 2D:
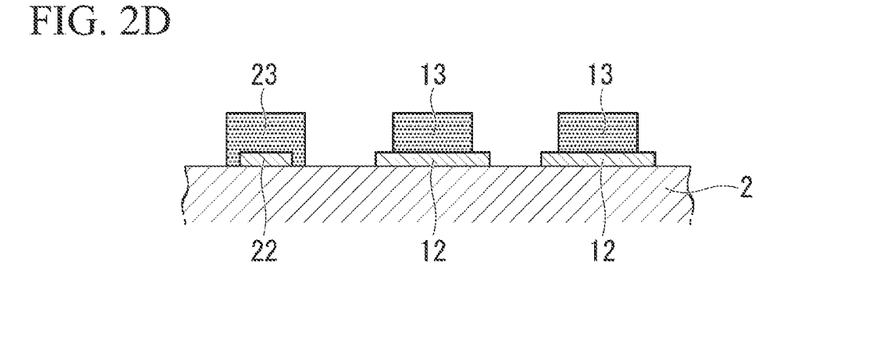
FIG. 2D is a cross-sectional view showing the manufacturing process of the connection part and the alignment mark of the semiconductor device according to the embodiment of the present invention.

FIG. 2D shows a state in which, after the bumps 13 and the bump 23 are formed, the resist 34 is removed. The bumps 13 are formed so that parts of the surfaces of the base electrodes 12 are exposed. The bump 23 is formed to cover the entire surface of the base electrode 22.

In the present embodiment, alignment can be performed such that a positional deviation of the bumps 13 occurring during formation of the bumps 13 is absorbed.

Figure 3:
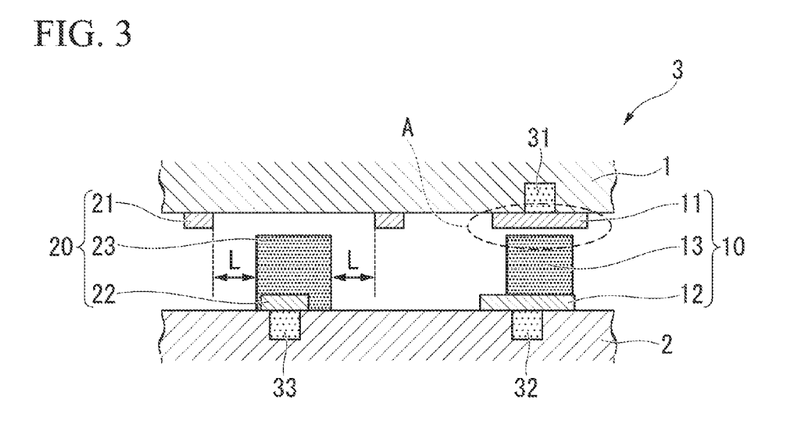
FIG. 3 is a cross-sectional view of the semiconductor device in an alignment process of the semiconductor device according to the embodiment of the present invention.

FIG. 3 shows a cross-section of the semiconductor device according to the present embodiment in the alignment process of the semiconductor device. In the semiconductor device 3 shown in FIG. 3, there is a positional deviation of the bump 13 occurring when the bump 13 is formed on the surface of the base electrode 12. When the bump 13 deviates from the base electrode 12 in the process of forming the bump 13 and the bump 23, the bump 23 likewise deviates from the base electrode 22. The amount of the positional deviation of the bump 23 is substantially the same as the amount of the positional deviation of the bump 13. For this reason, even when the bump 13 deviates from the base electrode 12 and the bump 23 deviates from the base electrode 22, the distance between the bump 13 and the bump 23 is substantially the same as the designed value.

In the alignment process of the semiconductor device according to the present embodiment, alignment is performed with reference to the distance between the base electrode 21 and the bump 23. For this reason, when alignment is performed so that the distance between the base electrode 21 and the bump 23 is uniform within the alignment mark 20, the positions of the base electrode 11 and the bump 13 are aligned with each other. In other words, even though the bump 13 deviates from the base electrode 12, alignment can be performed with high accuracy so that the position of the base electrode 11 is aligned with the position of the bump 13 (see the region surrounded by the dashed line A of FIG. 3). Therefore, in the semiconductor device according to the present embodiment, connection strength of the connection part, an electrical characteristic of the connection part, and the like can be improved.

Figure 4:
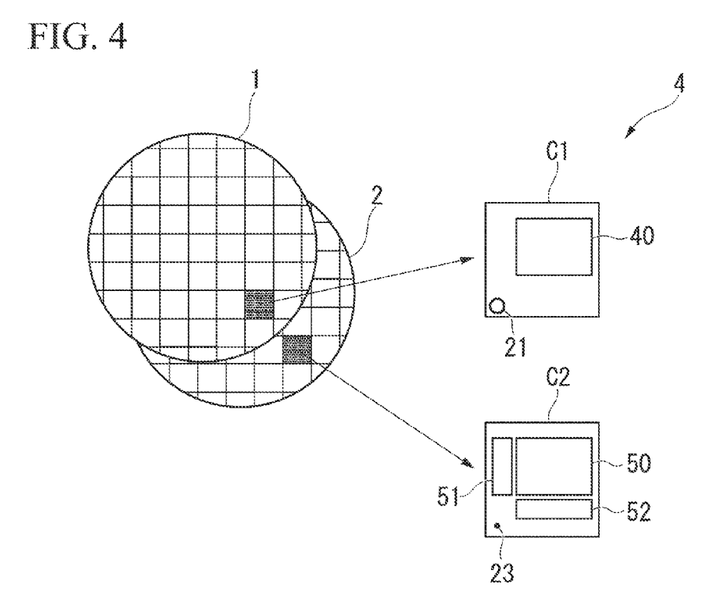
FIG. 4 is a plan view of a semiconductor substrate which constitutes the semiconductor device according to the embodiment of the present invention.

FIG. 4 shows a state in which the semiconductor substrate 1 and the semiconductor substrate 2 constituting the semiconductor device 3 according to the present embodiment are seen in plan view. A plurality of chips are disposed in the respective semiconductor substrate 1 and the semiconductor substrate 2. A plurality of chips C1 are disposed on the semiconductor substrate 1. A plurality of chips C2 are disposed on the semiconductor substrate 2. After the semiconductor substrate 1 and the semiconductor substrate 2 are connected to each other, the connected substrates are divided into the plurality of chips. The chip C1 and the chip C2 after the division constitute one semiconductor device.

In FIG. 4, positions of the internal constitutions of the chips when the chip C1 and the chip C2 are seen in plan view are shown. In the example shown in FIG. 4, a semiconductor device constituted by the chip C1 and the chip C2 is a solid-state imaging device 4.

The chip C1 has a pixel circuit region (photoelectric conversion element) 40. The pixel circuit region 40 is a region in which a plurality of pixels which include the photoelectric conversion element which outputs signals depending on an input light amount are two-dimensionally arrayed. At an end part of the chip C1, the base electrode 21 constituting the alignment mark 20 is disposed.

The chip C2 has a signal-processing circuit region (processing circuit) 50, a vertical scanning circuit region 51, and a horizontal scanning circuit region 52. A readout circuit and a processing circuit are disposed in the signal-processing circuit region 50. The readout circuit includes a capacitor which accumulates signals generated by the photoelectric conversion element of the pixel circuit region 40 and a MOS transistor which reads out the signals accumulated in the capacitor. The processing circuit performs an analog signal process such as amplification and noise removal on a read out signal. A vertical scanning circuit which outputs control signals for performing processes on each row of the pixel array is disposed in the vertical scanning circuit region 51. A horizontal scanning circuit which outputs control signals for sequentially outputting signals processed in the signal-processing circuit region 50 to the outside is disposed in the horizontal scanning circuit region 52. The base electrode 22 and the bump 23 constituting the alignment mark 20 are disposed at an end part of the chip C2. The base electrode 22 is not illustrated in FIG. 4.

Figure 5:
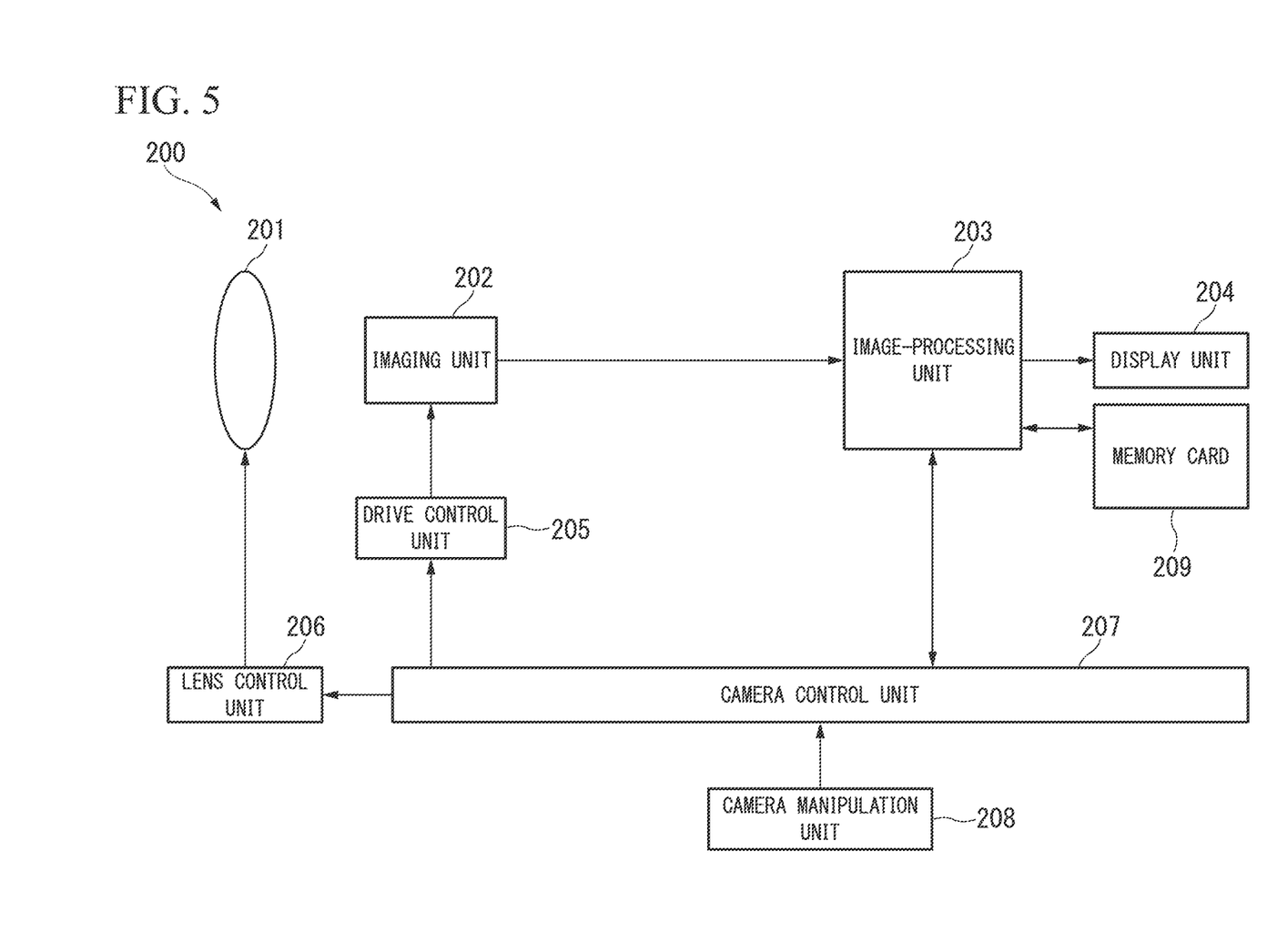
FIG. 5 is a block diagram showing a configuration of an imaging device according to the embodiment of the present invention.

FIG. 5 shows a configuration of an imaging device which has a solid-state imaging device that is an example of the semiconductor device according to the present embodiment. The imaging device according to an aspect of the present invention may be an electronic apparatus with an imaging function, or may be a digital camera, a digital video camera, an endoscope, or the like.

The imaging device 200 shown in FIG. 5 includes a lens 201, an imaging unit (solid-state imaging device) 202, an image-processing unit 203, a display unit 204, a drive control unit 205, a lens control unit 206, a camera control unit 207, and a camera manipulation unit 208. FIG. 5 also shows a memory card 209. The memory card 209, however, may be configured to be attachable to and detachable from the imaging device, and therefore the memory card 209 need not be an intrinsic constitution of the imaging device.

The lens 201 is a photographing lens for forming optical images of subjects on an imaging plane of the imaging unit 202 which constitutes the solid-state imaging device. The imaging unit 202 converts an optical image of a subject formed by the lens 201 into a digital image signal through photoelectric conversion, and outputs the image signal to the image-processing unit 203. The image-processing unit 203 performs various digital image processes on the image signal output from the imaging unit 202.

The display unit 204 displays images based on images signals which have undergone image processes for display by the image-processing unit 203. The display unit 204 can not only display still images but can also perform dynamic image (live view) display in which images of a capturing range are displayed in real time. The drive control unit 205 controls operations of the imaging unit 202 based on instructions from the camera control unit 207. The lens control unit 206 controls the stop and focus positions of the lens 201 based on instructions from the camera control unit 207.

The camera control unit 207 controls the entire imaging device 200. Operations of the camera control unit 207 are regulated by a program stored in a ROM included in the imaging device 200. The camera control unit 207 reads out this program and performs various controls in accordance with the content regulated by the program. The camera manipulation unit 208 has various members for manipulations for a user performing various manipulation inputs with respect to the imaging device 200. The camera manipulation unit 208 outputs signals based on results of the manipulation inputs to the camera control unit 207. As a specific example of the camera manipulation unit 208, a power switch for turning on and off the power of the imaging device 200, a release button for instructing photographing of a still image, a still-image photographing mode switch for switching a still-image photographing mode into a single-shoot mode and a continuous-shoot mode, and the like are exemplified. The memory card 209 is a recording medium for saving image signals processed by the image-processing unit 203 for the purpose of recording.

Figure 6:
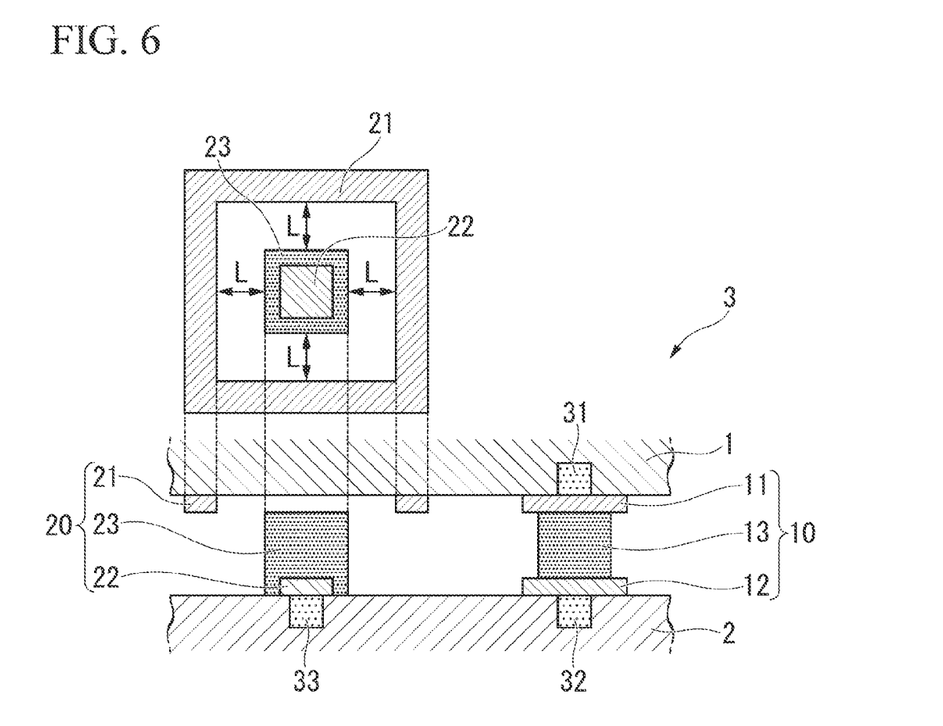
FIG. 6 is a plan view and a cross-sectional view showing another configuration of the main part of the semiconductor device according to the embodiment of the present invention.
Figure 7:
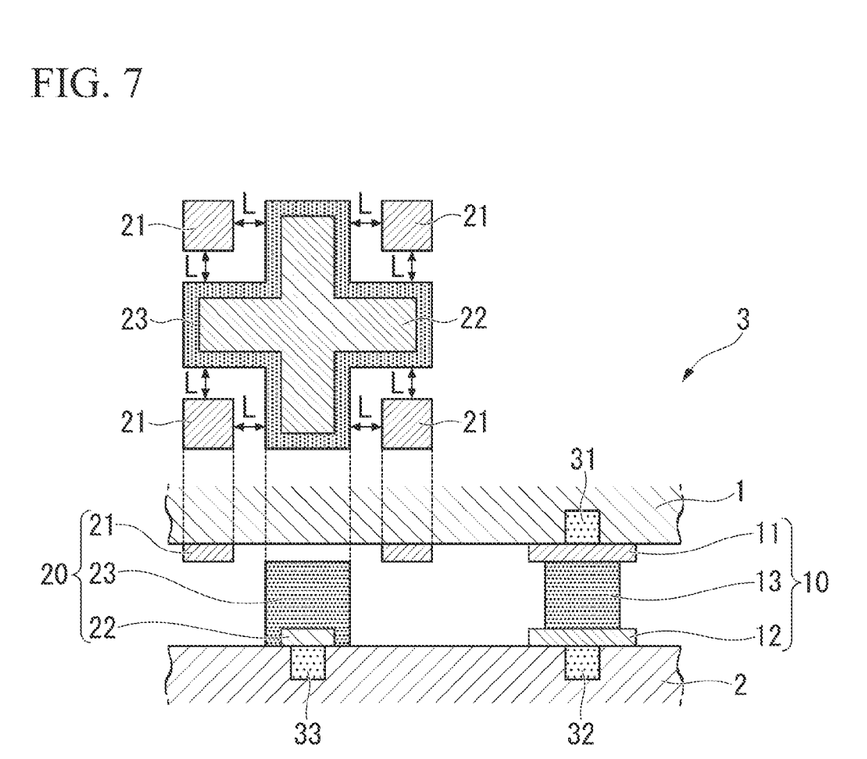
FIG. 7 is a plan view and a cross-sectional view showing still another configuration of the main part of the semiconductor device according to the embodiment of the present invention.

Next, a modified example of the semiconductor device according to the present embodiment will be described. FIGS. 6 and 7 show other examples of the shape of the alignment mark. The upper drawings of FIGS. 6 and 7 show states in which alignment marks provided on the semiconductor device are seen in plan view. The lower drawings of FIGS. 6 and 7 show a cross-section of the semiconductor device.

In the semiconductor device shown in FIG. 6, the shape of the alignment mark 20 is a quadrangle shape. To be more specific, when the semiconductor substrate 1 and the semiconductor substrate 2 are seen in plan view, the base electrode 21 has a quadrangle (square) shape whose inner part is hollow, and the base electrode 22 and the bump 23 have quadrangle (square) shapes. As described, a shape of the alignment mark 20 may be a polygonal shape having three or more angles. An angle of the polygonal shape of the alignment mark 20 may be rounded. In the present embodiment, the base electrode 21 constituting the alignment mark 20 is formed to surround the perimeter of the bump 23. The base electrode 21, however, may not surround the perimeter of the bump 23.

In the semiconductor device shown in FIG. 7, the shape of the alignment mark 20 is a more complicated shape. To be more specific, when the semiconductor substrate 1 and the semiconductor substrate 2 are seen in plan view, the base electrode 22 has a cross shape, and the base electrode 21 is divided into four quadrangles. The four pieces of the base electrode 21 are respectively disposed in four spots of the upper-left, upper-right, lower-left, and lower-right sides of the base electrode 22. In an alignment process using the alignment mark 20 shown in FIG. 7, relative positions of the semiconductor substrate 1 and the semiconductor substrate 2 in the horizontal direction are adjusted so that respective distances between the four pieces of the base electrode 21 and the bump 23 are all a distance L. In comparison to the alignment process using the alignment mark 20 shown in FIG. 1, the number of spots on which gaps of the alignment mark are to be checked further increases in the alignment process using the alignment mark 20 shown in FIG. 7. For this reason, accuracy in alignment is further improved.

A shape of an alignment mark may be one other than the shape of the alignment marks shown in FIGS. 1, 6, and 7. An alignment mark may be configured to include at least a first mark that is disposed on a first substrate and a second mark that is disposed at a position on a second substrate which corresponds to the position of the first mark. A shape of an alignment mark may be one which enables alignment.

Figure 8:
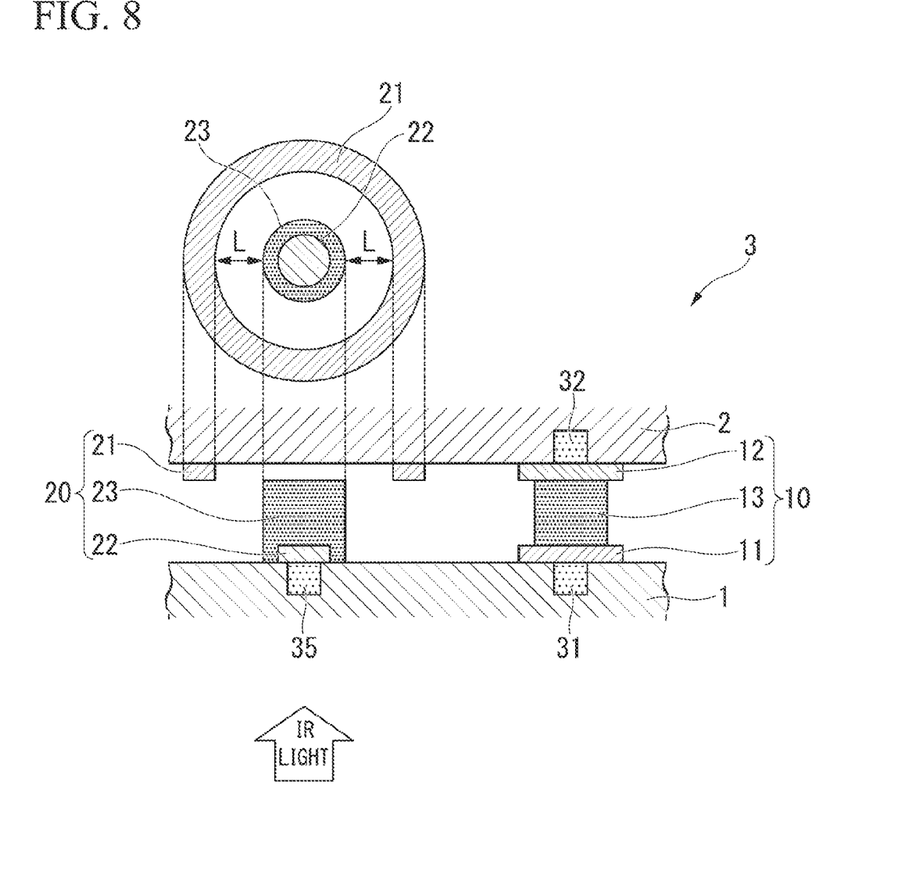
FIG. 8 shows a plan view and a cross-sectional view showing still another configuration of the main part of the semiconductor device according to the embodiment of the present invention.

The bump 23 is formed on the semiconductor substrate 2 in the semiconductor device 3 shown in FIG. 1. The bump 23, however, may be formed on the semiconductor substrate 1. FIG. 8 shows another configuration of the main part of the semiconductor device 3 which has the semiconductor substrate 1 on which the bump 23 is formed. The upper drawing of FIG. 8 shows a state in which the alignment mark provided in the semiconductor device 3 is seen in plan view. The lower drawing of FIG. 8 shows a cross-section of the semiconductor device 3. Differences from the configuration shown in FIG. 1 will be described below.

The ring-shaped base electrode 21 is formed on a surface of the semiconductor substrate 2, and the circular-shaped base electrode 22 and bump 23 are formed on a surface of the semiconductor substrate 1. The base electrode 22 is connected with a through-hole 35 that is formed inside the semiconductor substrate 1. The through-hole 35 is exposed on the surface of the semiconductor substrate 1. The exposed portion of the through-hole 35 is connected with the base electrode 22. The through-hole 35 is connected to a wiring layer formed inside the semiconductor substrate 1, which is not illustrated.

In the semiconductor device 3 shown in FIG. 8, the semiconductor substrate 2 corresponds to a first substrate. The semiconductor substrate 1 corresponds to a second substrate. The base electrode 12 corresponds to a first electrode disposed on the first substrate. The base electrode 11 corresponds to a second electrode disposed on the second substrate. The base electrode 21 corresponds to a first mark disposed on the first substrate. The bump 23 corresponds to a second mark disposed at a position on the semiconductor substrate 2 which corresponds to the position of the first mark.

When the semiconductor device is a solid-state imaging device, the pixel circuit region 40 is disposed on the semiconductor substrate 1, and the signal-processing circuit region 50, the vertical scanning circuit region 51, and the horizontal scanning circuit region 52 are disposed on the semiconductor substrate 2 as shown in FIG. 4. In the semiconductor device 3 shown in FIG. 8, the bump 23 is formed on the surface of the semiconductor substrate 1 on which the pixel circuit region 40 which includes a photoelectric conversion element is disposed. A manufacturing process of the connection part 10 and the alignment mark 20 is the same as that shown in FIGS. 2A to 2D.

As described above, according to the semiconductor device 3 according to the present embodiment, the sum of the height of the base electrode 21 and the height of the bump 23 is substantially equal to the sum of the height of the base electrode 11, the height of the base electrode 12, and the height of the bump 13. For this reason, the position of the surface of the base electrode 21 and the position of the surface of the bump 23 are substantially the same in the direction perpendicular to the main surface of the semiconductor substrate 1 or the semiconductor substrate 2. Accordingly, the positions can be focused, and therefore accuracy in alignment can be improved.

Since the base electrode 21 and the bump 23 constitute the alignment mark, an alignment mark can be formed using a manufacturing process of forming the base electrode 11 and the bump 13.

When the semiconductor substrate 1 and the semiconductor substrate 2 are seen in plan view, the base electrode 21 and the bump 23 are formed such that the base electrode 21 surrounds the perimeter of the bump 23. For this reason, alignment can be easily performed with reference to the distance between the inner circumference of the base electrode 21 and the outer circumference of the bump 23.

The base electrode 22 and the bump 23 are formed such that the bump 23 is disposed on the surface of the base electrode 22 and the width of the base electrode 22 is equal to or smaller than the width of the bump 23. For this reason, alignment can be performed in the state in which the outer circumference of the bump 23 is not obstructed by the base electrode 22. Thus, accuracy in alignment can be improved.

Although the configuration of the semiconductor device in which the two substrates are connected by the connection part has been shown in the present embodiment, three or more substrates may be connected by a connection part. In the case of a semiconductor device in which three or more substrates are connected by a connection part, two out of the three or more substrates correspond to a first substrate and a second substrate.

Although exemplary embodiments of the present invention have been described above, the present invention is not limited thereto. Addition, omission, substitution, and other modifications may be made to the present invention without departing from the spirit and scope of the present invention. The present invention is not limited by the above description, but only limited by the accompanying claims.

What is claimed is:

1. A semiconductor device comprising:
   a first substrate;
   a second substrate;
   a connection part which electrically connects the first substrate and the second substrate; and
   an alignment mark which is used in alignment of the first substrate and the second substrate,
   wherein the connection part includes:
      a first electrode which is disposed on the first substrate;
      a second electrode which is disposed on the second substrate; and
      a connection bump which is disposed between the first electrode and the second electrode and which electrically connects the first electrode and the second electrode,
   wherein the alignment mark includes:
      a first mark which is disposed on the first substrate; and
      a second mark which is disposed on the second substrate such that the second mark is aligned with respect to the first mark within a predetermined alignment error, the second mark being insulated from the first mark, and
   wherein a sum of a height of the first mark and a height of the second mark is substantially equal to a sum of a height of the first electrode, a height of the second electrode, and a height of the connection bump.

2. The semiconductor device according to claim 1, wherein the height of the second mark is substantially equal to a sum of the height of the second electrode and the height of the connection bump.

3. The semiconductor device according to claim 2,
   wherein the first mark is an electrode which is disposed on the first substrate, and
   wherein the second mark is a bump which is disposed on the second substrate.

4. The semiconductor device according to claim 3, wherein, when the first substrate and the second substrate are seen in plan view, the first mark surrounds the second mark.

5. The semiconductor device according to claim 3,
   wherein the bump is connected with the second substrate and a surface of a base electrode which is formed on a surface of the second substrate, and
   wherein a width of the base electrode is equal to or smaller than a width of the bump.

6. A solid-state imaging device comprising:
   the semiconductor device according to claim 3,
   wherein the second substrate includes a photoelectric conversion element which is configured to output a signal depending on an amount of incident light, and
   wherein the first substrate includes a processing circuit which is configured to process the signal output from the photoelectric conversion element.

7. An imaging device comprising:
   the solid-state imaging device according to claim 6.

8. A solid-state imaging device comprising:
   the semiiconductor device according to claim 1,
   wherein the first substrate includes a photoelectric conversion element which is configured to output a signal depending on an amount of incident light, and
   wherein the second substrate includes a processing circuit which is configured to process the signal output from the photoelectric conversion element.

9. An imaging device comprising:
   the solid-state imaging device according to claim 8.

* * * * *